United States Patent [19]
Hanafi et al.

[11] Patent Number: 6,063,699
[45] Date of Patent: May 16, 2000

[54] METHODS FOR MAKING HIGH-ASPECT RATIO HOLES IN SEMICONDUCTOR AND ITS APPLICATION TO A GATE DAMASCENE PROCESS FOR SUB- 0.05 MICRON MOSFETS

[75] Inventors: Hussein Ibrahim Hanafi, Basking Ridge, N.J.; Young Hoon Lee, Somers; Hsingjen Wann, Briarcliff Manor, both of N.Y.

[73] Assignee: International Business Machines Corporation, Armonk, N.Y.

[21] Appl. No.: 09/136,325

[22] Filed: Aug. 19, 1998

[51] Int. Cl.[7] .................. H01L 21/3205; H01L 21/4763
[52] U.S. Cl. .................. 438/589; 438/270; 438/675; 438/637; 257/368
[58] Field of Search .................. 438/589, 675, 438/270, 637, 424, 221, 224, 296, 359; 257/368

[56] References Cited

U.S. PATENT DOCUMENTS

| | | | |
|---|---|---|---|
| 4,160,991 | 7/1979 | Anantha et al. | 438/270 |
| 5,358,882 | 10/1994 | Bertagnolli et al. | 438/270 |
| 5,397,731 | 3/1995 | Takemura | 438/424 |
| 5,489,792 | 2/1996 | Hu et al. | |
| 5,599,728 | 2/1997 | Hu et al. | |
| 5,777,514 | 6/1998 | Matsuda et al. | 438/589 |

*Primary Examiner*—Charles Bowers
*Assistant Examiner*—David S Blum
*Attorney, Agent, or Firm*—Scully, Scott, Murphy & Presser

[57] ABSTRACT

The present invention provides a process of fabricating high aspect ratio holes (H/L is 2 or greater) in a semiconductor structure wherein a masked gate-like reactive ion etch process is employed. The high aspect ratio holes have perfectly vertical sidewalls thus they are particularly useful in fabricating gate electrodes of sub-0.05 $\mu$m MOSFETs using a damascene process.

17 Claims, 7 Drawing Sheets

METHODS FOR MAKING HIGH-ASPECT RATIO HOLES IN SEMICONDUCTOR AND ITS APPLICATION TO A GATE DAMASCENE PROCESS FOR SUB- 0.05 MICRON MOSFETS

RELATED APPLICATIONS

This application is related to U.S. application Ser. No. 09/026,093, filed Feb. 19, 1998 which is commonly owned by the assignee of the present application.

FIELD OF THE INVENTION

The present invention relates to a process of forming a hole in a semiconductor structure whereby the hole has perfectly vertical sidewalls and a high aspect ratio. The term "aspect ratio" as used herein is defined as the ratio of the hole's height (H) to its width (W) whereas the term "high aspect ratio" is used herein to denote a ratio of a hole's H/W which is about 2 or greater. Such holes having the above-mentioned properties are especially suitable for use in the formation of a gate electrode of a sub-0.05 $\mu$m metal oxide semiconductor field effect transistor (MOSFET) using a damascene process.

BACKAROUND OF THE INVENTION

As semiconductor technologies are scaled below 0.05 $\mu$m, there is a need for high aspect ratio holes. These high aspect ratio holes are especially needed in the semiconductor front end, i.e. the area of the semiconductor containing active device regions, as well as back end, i.e. the area of the semiconductor wherein interconnections are made.

One particular use of these high aspect ratio holes in the front end of complementary metal oxide semiconductor (CMOS) technologies is in the fabrication of sub-0.05 $\mu$m field effect transistor (FET) devices with gate electrodes formed using a damascene process. Such a prior art process is disclosed, for example, in co-assigned U.S. application Ser. No. 09/026,093, filed Feb. 19, 1998, the contents of which are incorporated herein by reference.

For FET devices, such as disclosed in the above mentioned co-assigned U.S. patent application, gate holes with vertical sidewalls and a high aspect ratio of 2 or greater are required. This is because the gate hole depth is not to be scaled in the same proportion as its size to assure low gate sheet resistance and the required spacer width. For example, for 0.1 $\mu$m CMOS technology, the gate hole depth is 0.2 $\mu$m resulting in a hole aspect ratio of 2. For 0.025 $\mu$m CMOS technology, the gate hole depth is about 0.15 $\mu$m which raises the aspect ratio to 6.

In the aforementioned related U.S. application as well as others, the high aspect ratio holes are formed in the front end of the structure by utilizing a reactive ion etching (RIE) process. Although RIE can be utilized in providing high aspect ratio holes, RIE processes damage the surrounding semiconductor substrate or wafer. In the prior art, these damaged regions are removed by utilizing a subsequent oxidation step and annealing step that is carried out at temperatures of 700° C. or higher. As such, additional processing steps and costs are added to the overall MOSFET processing scheme and are eventually past along to the consumer.

In view of the drawbacks with prior art RIE processes in forming high aspect ratio holes, there is a continued need to develop a new and improved process of fabricating high aspect ratio holes having vertical sidewalls in the front end of a semiconductor structure as well as the back end of a semiconductor structure.

SUMMARY OF THE INVENTION

One object of the present invention is to provide a process of fabricating a high aspect ratio hole (H/W is 2 or greater) in a semiconductor structure containing at least a semiconductor substrate or wafer.

Another object of the present invention is to provide a process of fabricating high aspect ratio holes such that no damages are introduced into the semiconductor substrate or wafer thus eliminating the need for further processing steps like oxidation and annealing which are required in the prior art when RIE is used in forming high aspect ratio holes.

A still further object of the present invention is to provide a process of fabricating a high aspect ratio hole having perfectly vertical sidewalls by utilizing a sacrificial polysilicon layer having perfectly vertical sidewalls which is formed on a thick pad oxide layer.

A yet further object of the present invention is to provide a process of fabricating a high aspect ratio hole having vertical sidewalls wherein said high aspect ratio hole can be used in fabricating a gate electrode of a sub-0.05 $\mu$m MOSFET using a damascene process.

These as well as other objects and advantages can be achieved in the present invention by utilizing a masked "gate-like RIE" process to fabricate a high aspect ratio hole in at least one surface of a semiconductor structure. It should be noted herein that the process of the present invention is capable of forming a high aspect ratio hole with perfectly vertical sidewalls in any material layers used in fabricating a semiconductor device. Thus, the high aspect ratio hole with perfectly vertical sidewalls can be fabricated, for example, into the semiconductor substrate or wafer or, it can be formed in materials layers that are on top of the semiconductor substrate or wafer. Specifically, the masked gate-like process of the present invention, which can be employed on the front end as well as the back end of a semiconductor structure, comprises the steps of:

(a) providing a semiconductor structure, said structure comprising at least a semiconductor substrate or wafer having a patterned region on at least one of its surfaces;

(b) applying a dielectric layer on top of said surface containing said patterned region;

(c) forming a film layer on the surface of the dielectric layer, wherein said film layer planarizes the semiconductor structure;

(d) etching back said planarized film layer and said dielectric layer stopping at said patterned region; and (e) removing said patterned region whereby a high aspect ratio hole having vertical sidewalls is formed in the semiconductor structure.

In accordance with one aspect of the present invention, steps (a)–(e) mentioned above can be used in fabricating a sub-0.05 $\mu$m MOSFET device wherein the gate electrode formed has perfectly vertical sidewalls and a high aspect ratio. When the process of the present invention is used in such an application, the initial semiconductor structure used in step (a) is fabricated by methods well known to those skilled in the art and the gate electrode is also fabricated in the high aspect ratio hole utilizing standard techniques well known to those skilled in the art.

For example, the initial structure used in step (a) can be one wherein the semiconductor substrate or wafer has shallow trench isolation regions embedded therein and the top surface of the semiconductor substrate or wafer contains a pad oxide layer and a patterned region of polysilicon formed over said pad oxide. After providing such a structure, the structure is subjected to steps (b)–(e) above; and thereafter the gate oxide is grown and the gate electrode is deposited in the high aspect ratio hole utilizing a FET process such as is disclosed in the aforementioned related co-assigned U.S. patent application.

DETAILED DESCRIPTION OF THE INVENTION

Figure 1:
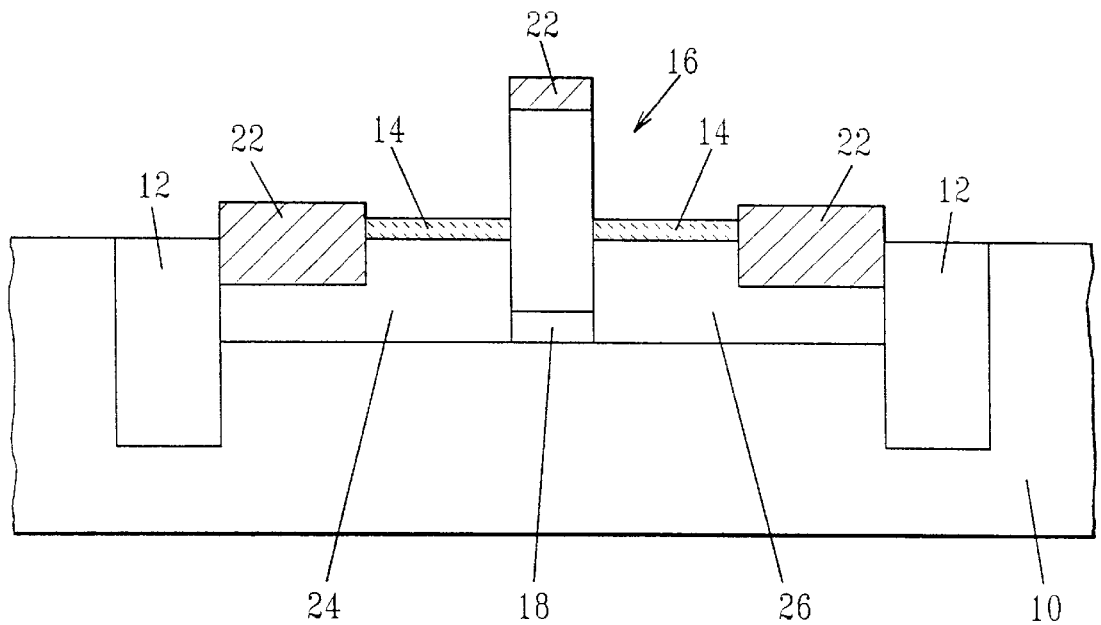
FIG. 1 is a cross-sectional view showing a recessed gate structure of a MOSFET which can be prepared utilizing the high aspect hole fabrication process of the present invention.

The present invention, which provides a process of fabricating a high aspect ratio hole in at least one layer of a semiconductor structure, will now be described in greater detail by referring to the drawings that accompany this application. It should be noted that in the drawings like elements or components are referred to by like and corresponding reference numerals.

Attention is first made to FIG. 1 which is a cross-sectional view of a MOSFET structure that can be fabricated using the high aspect ratio hole formation process of the present invention. It is emphasized that although application of the present process is directed to forming a MOSFET structure, the process of the present invention is nevertheless applicable in any semiconductor manufacturing process requiring a hole having vertical sidewalls and a high aspect ratio. The present invention can thus be employed in any front end or back end semiconductor process which requires a high aspect ratio hole. Moreover, the high aspect ratio hole may be formed in any material layers of a semiconductor structure including the semiconductor substrate or wafer. Hence, the present invention can be used in MOSFET technologies as well as interconnect technologies.

Referring back to FIG. 1, the MOSFET structure shown in FIG. 1 comprises a semiconductor substrate or wafer 10 which contains shallow trench isolation regions 12 embedded therein. The structure further includes a patterned pad oxide layer 14 that is formed on the top surface of semiconductor substrate or wafer 10. The thickness of the pad oxide layer should be thicker than the corresponding gate oxide. Typically, the pad oxide layer has a thickness of from about 8 to about 20 nm. This feature is important in the present invention since it is essential in fabricating a hole having perfectly vertical sidewalls. Positioned between the shallow trench isolation regions is a gate region 16 which includes a gate oxide 18, a polygate 20 and a metal contact 22. The gate region has perfectly vertical sidewalls, a high aspect ratio and is embedded within semiconductor substrate or wafer 10.

It is again emphasized that the high aspect ratio hole is not limited to be embedded in the semiconductor substrate or wafer. The above description holds for fabricating recessed gate MOSFET devices. When used in other applications contemplated herein, the high aspect ratio hole may be formed in materials layers that are formed on top of the semiconductor substrate or wafer. In those other applications, the high aspect ratio hole may or may not extend into the semiconductor structure.

Adjacent to gate region 16 and spaced apart therebetween is a source region 24 and a drain region 26 which are embedded in semiconductor substrate or wafer 10 and can be electrically connected to each other by applying a specific potential to gate region or electrode 16. Metal contacts 22 are also present on the surface of the semiconductor structure.

The above described figure represents a recessed gate semiconductor structure which can utilize the process of the present invention. Specifically, the process of the present invention which forms a high aspect ratio hole with perfectly vertical sidewalls in a semiconductor structure can be employed in conjunction with another known MOSFET processing steps in fabricating the structure shown in FIG. 1.

The description that follows describes, in detail, how to fabricate high aspect ratio holes with perfectly vertical sidewalls in a semiconductor structure. It should be noted that although only one hole is shown in the drawings, the process of the present invention can be used to fabricate a plurality of such holes in a semiconductor structure. It is also emphasized that although the present invention exemplifies forming the high aspect ratio hole with perfectly vertical sidewalls in the semiconductor substrate or wafer, the present invention is not limited thereto. Instead, the high aspect ratio hole of the present invention can be fabricated in any other material layers within a semiconductor structure.

Figure 2A:
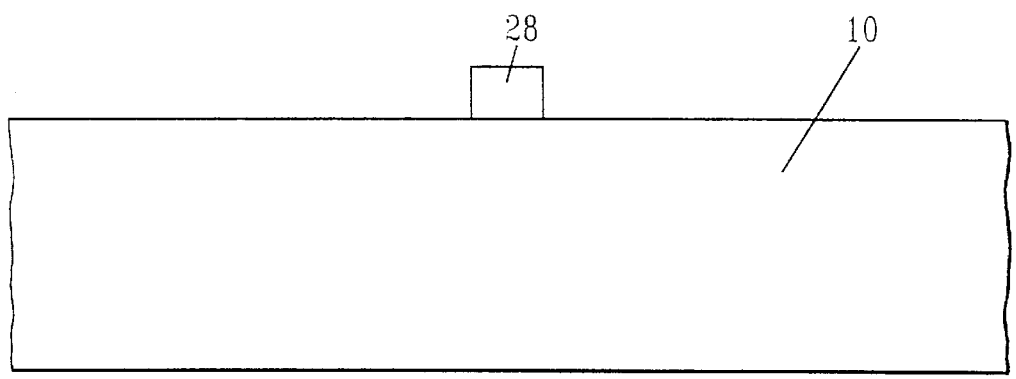
FIGS. 2(a)–(e) are cross-sectional views showing the various processing steps that can be employed in the present invention in fabricating a high aspect ratio hole in a semiconductor structure.

In accordance with the present invention, an initial semiconductor structure such as illustrated in FIG. 2(a) is first provided. Specifically, the semiconductor structure shown in FIG. 2(a) is a basic structure which can be employed in the present invention. Other components and layers besides those shown in FIG. 2(a) can be employed depending only upon the final electronic device being manufactured. Those other components and layers not shown in FIG. 2(a) are known to those skilled in the art and are thus within the contemplation of the present invention.

The semiconductor structure shown in FIG. 2(a) comprises a semiconductor substrate or wafer 10 which contains at least one patterned region 28, e.g. polysilicon, on one of its surfaces. The patterned region has perfectly vertical sidewalls associate therewith. The semiconductor substrate or wafer may be composed of any semiconductor material including, but not limited to: Si, Ge, SiGe, GaAs, GaP, InAs, InP and other III/V compounds. Of these semiconductor materials, it is highly preferred that Si be employed as semiconductor substrate or wafer 10.

The semiconductor substrate or wafer can be of the n-type or p-type depending upon the desired electronic device being manufactured. The semiconductor substrate or wafer may also contain active device regions or shallow trench isolation regions embedded in the surface of semiconductor substrate or wafer 10. For clarity, these active device regions and shallow trench isolation regions are not shown in FIG. 2(a). It should be noted however that the active device or shallow trench isolation regions may be formed at the interface of the semiconductor substrate or wafer which contains the patterned region or they may be formed on the opposite surface.

Figure 2B:
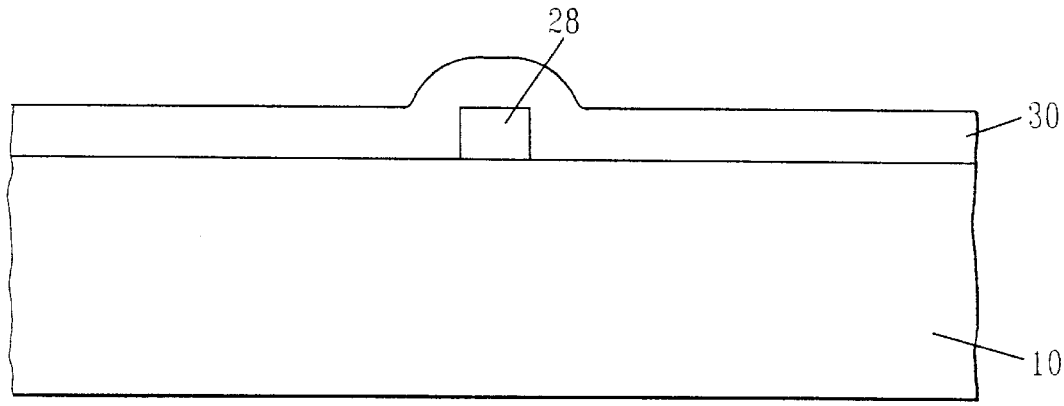

Next, as shown in FIG. 2(b), a dielectric layer 30 is formed on the surface of semiconductor substrate or wafer 10 containing patterned region 28. The dielectric layer is formed utilizing conventional deposition processes well known to those skilled in the art including, but not limited to: chemical vapor deposition, plasma vapor deposition, high density plasma vapor deposition, low density plasma vapor deposition, plasma-enhanced chemical vapor deposition and other like deposition processes. Although not critical to the present invention, the dielectric layer is deposited to a thickness of from about 100 to about 200 nm.

Suitable dielectric materials which can be used in forming layer 30 include, but are not limited to: $SiO_2$, $Si_3N_4$, polyimides, paralenes, silicon-containing polymers such as polysiloxane, diamond, diamond-like carbon and other like dielectric materials. The dielectric layer may be doped with a suitable dopant such as chlorine or fluorine. Of the aforementioned dielectric materials, it is highly preferred that $Si_3N_4$ be employed as dielectric layer 30.

Figure 2C:
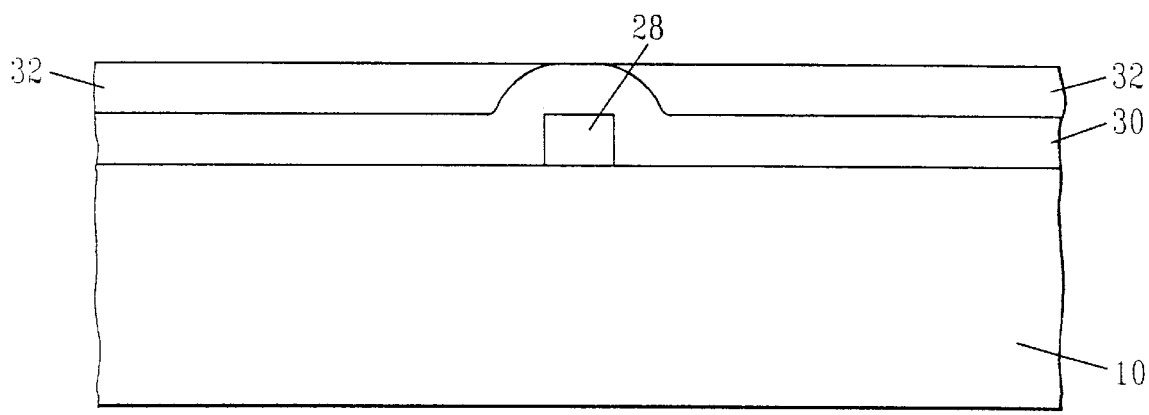

After forming a dielectric layer on the structure, film layer 32 is formed on top of dielectric layer 30 utilizing conventional deposition processes such as spin-on coating, dip coating, chemical vapor deposition, plasma chemical vapor deposition and other like deposition processes. A key aspect of this step of the present invention is that the deposition process and material employed must be capable of forming a planarized structure such as is shown in FIG. 2(c). Suitable materials used in forming film layer 32 include but are not limited to: spun-on glass as well as any photoresist. Of these materials, it is preferred the film layer 32 be composed of spun-on glass.

Figure 2D:
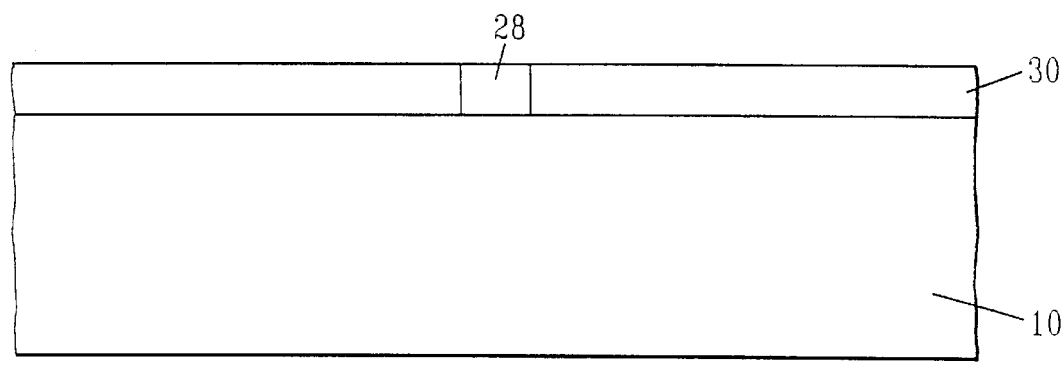

In accordance with the next step of the present invention, the structure shown in FIG. 2(c) is subjected to an etch back step wherein a selective etch process is employed in removing planarized film layer 32 and a portion of dielectric layer 30 stopping at patterned region 28. The etched back structure is shown in FIG. 2(d).

The etch back step employed in the present invention is any etching technique including dry etching and chemical etching which is highly selective in removing film layer 32 and dielectric layer 30 yet is capable of stopping at patterned region 28 of the structure. Suitable etching techniques which can be employed in the present invention include, but are not limited to: reactive ion etching, plasma etching, ion beam etching and other like etching processes. Of these etching processes, reactive ion etching (RIE) is highly preferred in providing the etched back structure of FIG. 2(d)

Figure 2E:
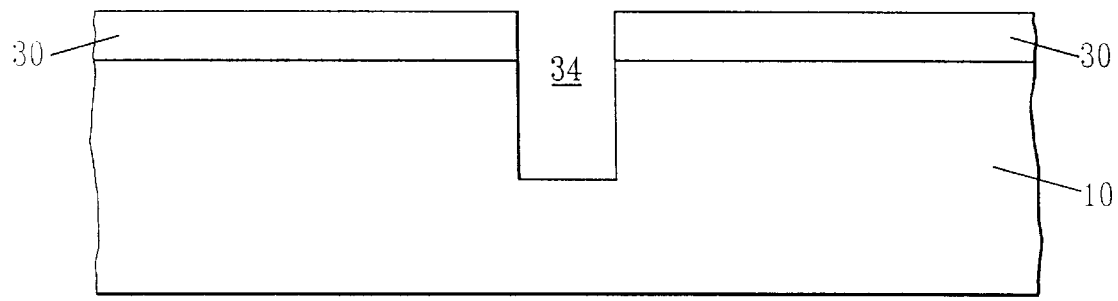

After the etch back step, a high aspect ratio hole 34 having a H/W ratio of 2 or greater and vertical sidewalls is formed by removing patterned region 28 as well as a portion of semiconductor substrate or wafer 10, see FIG. 2(e). It is again emphasized that the high aspect ratio hole may be formed in areas above the semiconductor substrate or wafer. In such embodiments, which are not illustrated in the drawings of the present invention, etching only removes materials layers wherein the hole is to be formed.

Hole 34 is formed in the semiconductor structure by utilizing an etching process which is highly selective in removing patterned region 28 and, as illustrated in the drawings, a portion of semiconductor substrate or wafer 10. Moreover, the etching process, e.g. RIE, ion beam, plasma etching and the like, must be capable of forming vertical sidewalls without damaging semiconductor substrate or wafer 10.

The above description and correlating figures, i.e. FIGS. 2(a)–(e), show the process that is employed in the present invention in forming a high aspect hole having vertical sidewalls in a surface of a semiconductor structure. The description that follows is directed to one application which employs the process of the present invention therein. Other applications known to those skilled in the art requiring high aspect ratio holes are also within the contemplation of the present invention.

Figure 3A:
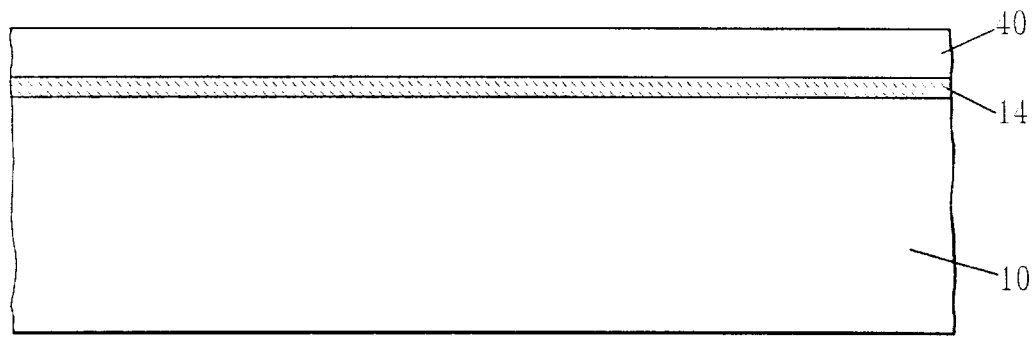
FIGS. 3(a)–(k) are cross-sectional views showing the various processing steps used in making the MOSFET structure of FIG. 1.

A description of employing the process of the present invention in fabricating a recessed gate sub-0.05 μm MOSFET will now be described with reference to FIGS. 3(a)–(k). Specifically, FIG. 3(a) shows a semiconductor structure which comprises a semiconductor substrate or wafer 10 having a pad oxide layer 14 on one of its surfaces. Atop of pad oxide layer 14 is a pad nitride layer 40.

The pad oxide layer, e.g. $SiO_2$, is formed atop semiconductor substrate or wafer 10 utilizing any conventional thermal growing process. The thickness of the grown pad oxide layer 14 is typically of from about 8 to about 14 nm.

Pad nitride layer 40 is composed of any nitride-containing compound which can serve as a barrier layer.

Suitable materials include, but are not limited to: $Si_3N_4$, TiN, $Al_3N_4$ and other like nitride-containing compounds. The pad nitride layer is deposited on top of oxide pad layer 14 utilizing standard deposition techniques such as low pressure chemical vapor deposition or chemical vapor deposition. The thickness of the deposited pad nitride layer is typically of from about 100 to about 200 nm.

Figure 3B:
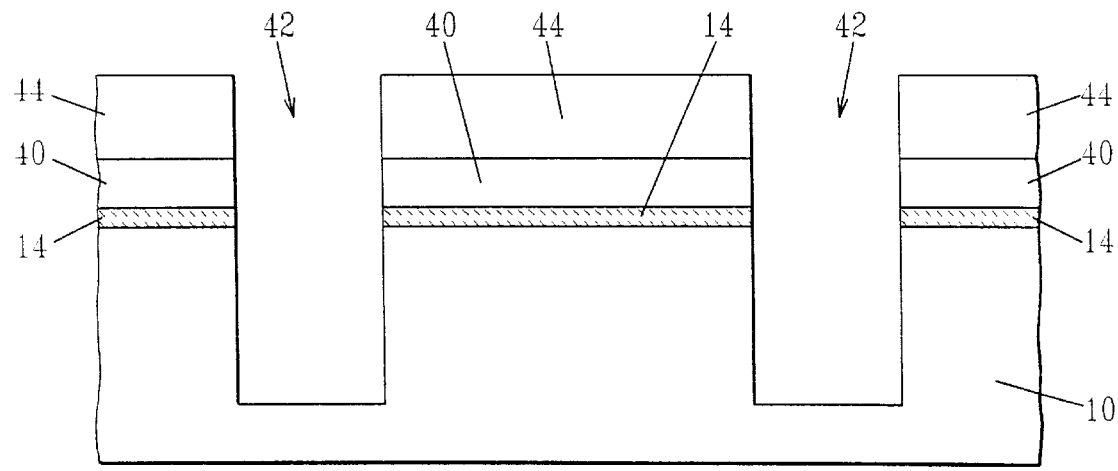

Next, as shown in FIG. 3(b), shallow trenches 42 are formed in the structure utilizing standard lithography and etching. The photoresist which is designed as element 44 in FIG. 3(b) is any conventional deep UV photoresist well known to those skilled in the art. The depth of the shallow trenches formed is dependent on the final electronic device being manufactured but typically the trenches are etched to a depth of from about 150 to about 300 nm in the semiconductor substrate or wafer.

Figure 3C:
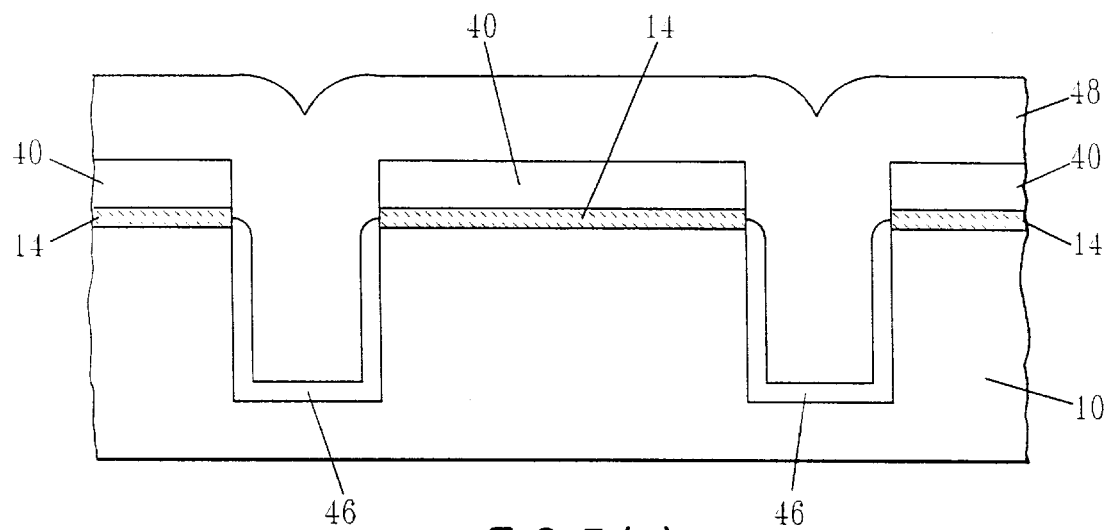

After shallow trench formation and stripping of the photoresist, the insides of trenches 42 are lined with a liner material 46 such as a thermal oxide and thereafter filled with a silicate 48 such as tetraethylorthosilicate (TEOS). These steps are illustrated in FIG. 3(c). It should be noted that in FIG. 1 shallow trench isolation regions are composed of trenches 42, liner material 46 and silicate 48.

Figure 3D:
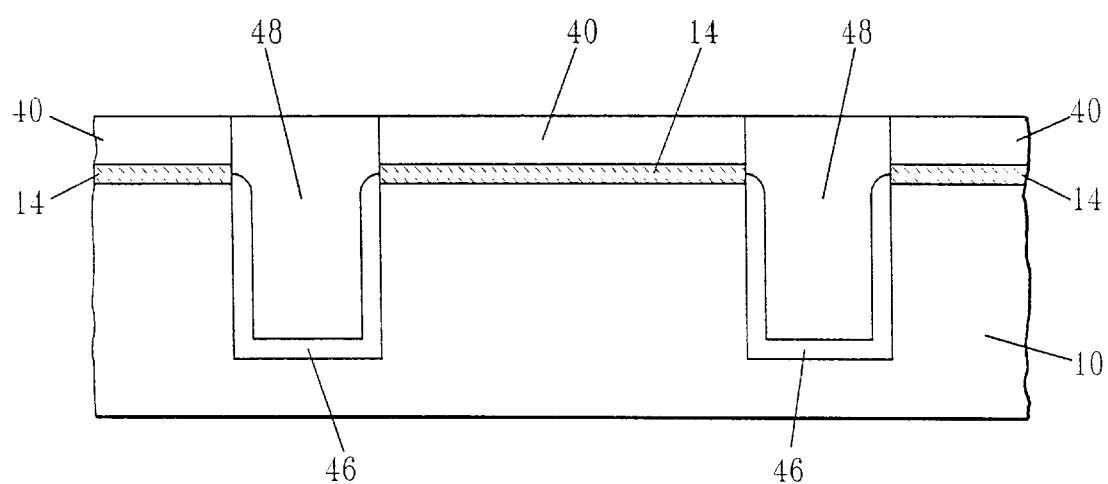

Next, as shown in FIG. 3(d), the structure is planarized stopping at nitride pad layer 40 utilizing conventional planarization techniques including chemical mechanical polishing, RIE and grinding.

Figure 3E:
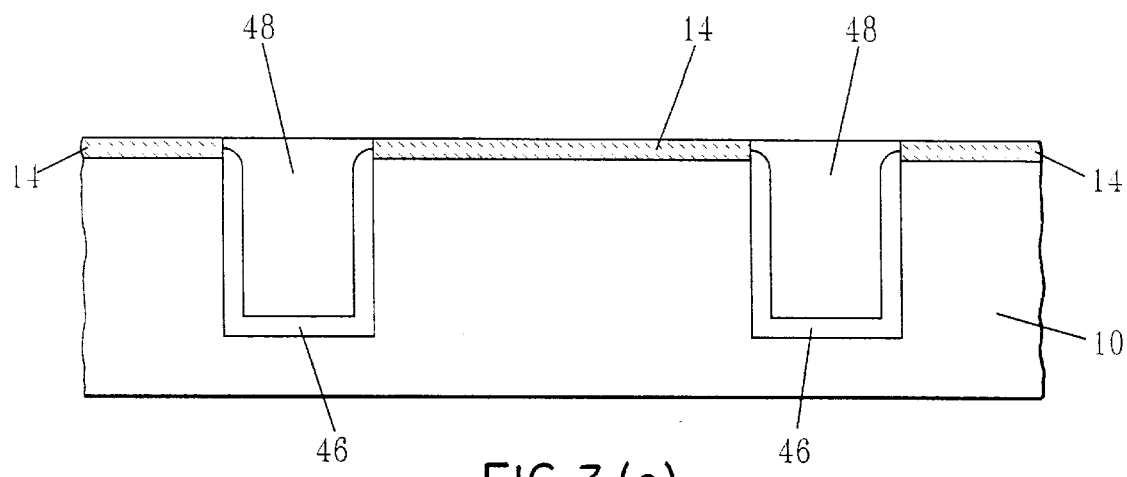

After planarization, nitride pad layer 40 and oxide pad layer 14 are stripped utilizing conventional stripping processes and a new pad oxide layer 14 having a thickness of from about 8 to about 20 nm is grown on the surface of the structure. The steps are shown in FIG. 3(e) wherein 14 is used to designate the newly formed pad oxide layers in the structure.

Figure 3F:
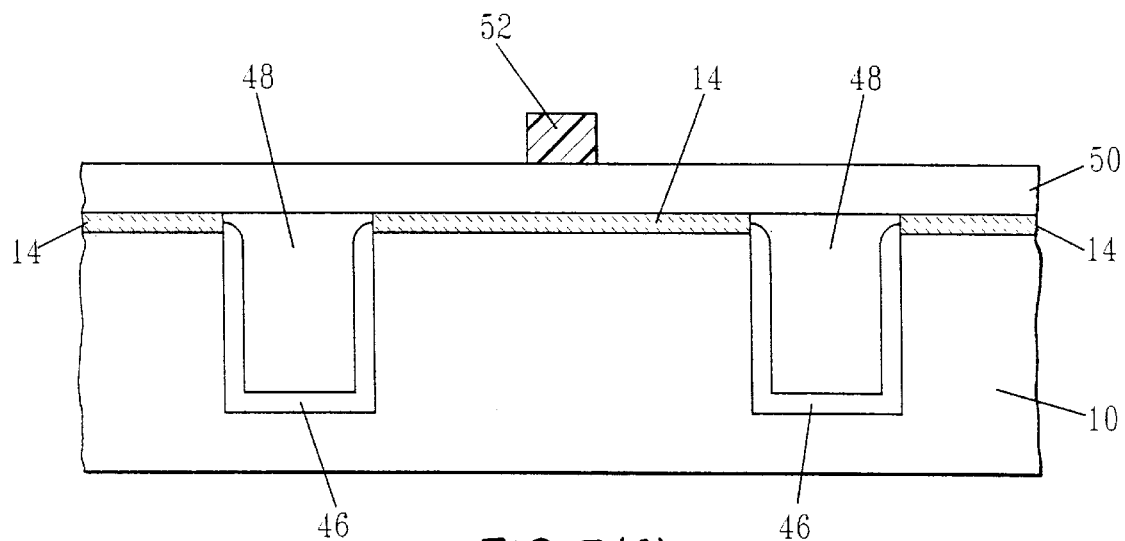

A polysilicon layer 50 having a thickness of from about 100 to about 200 nm is then deposited on the surface of pad oxide 14 utilizing standard deposition processes such as low pressure chemical vapor deposition. The polysilicon layer is a sacrificial layer which is removed. A resist 52 is then applied on a predetermined portion of polysilicon layer 50. These two steps are illustrated in FIG. 3(f).

Figure 3G:
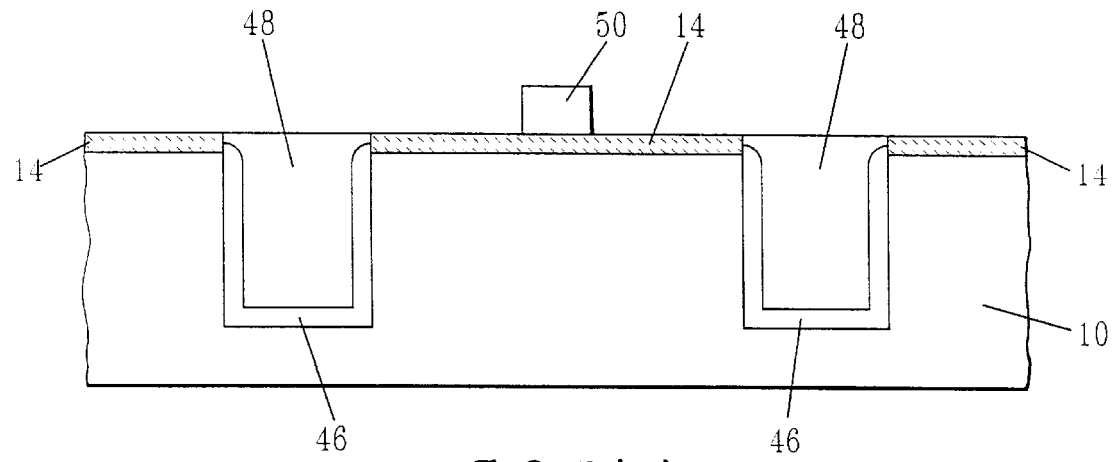
Figure 3H:
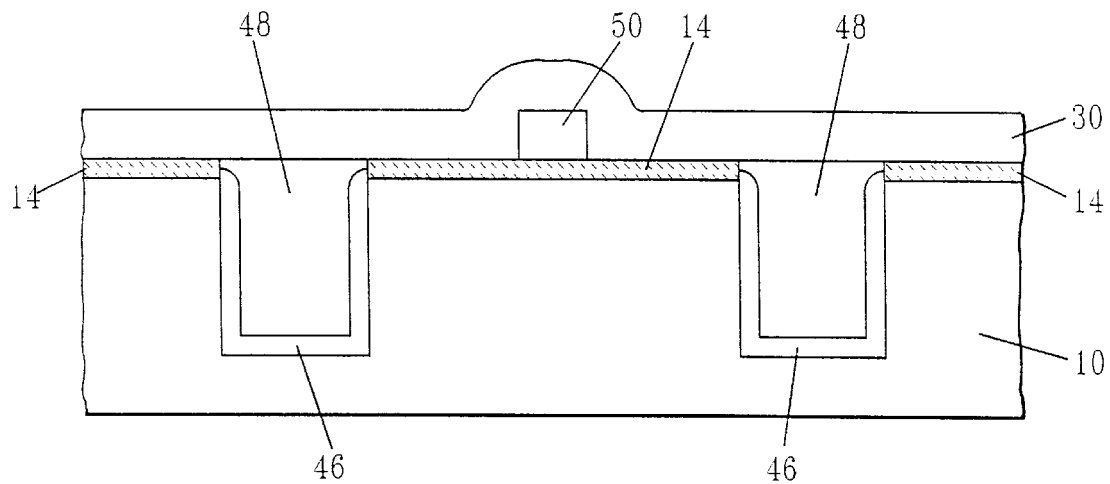
Figure 3I:
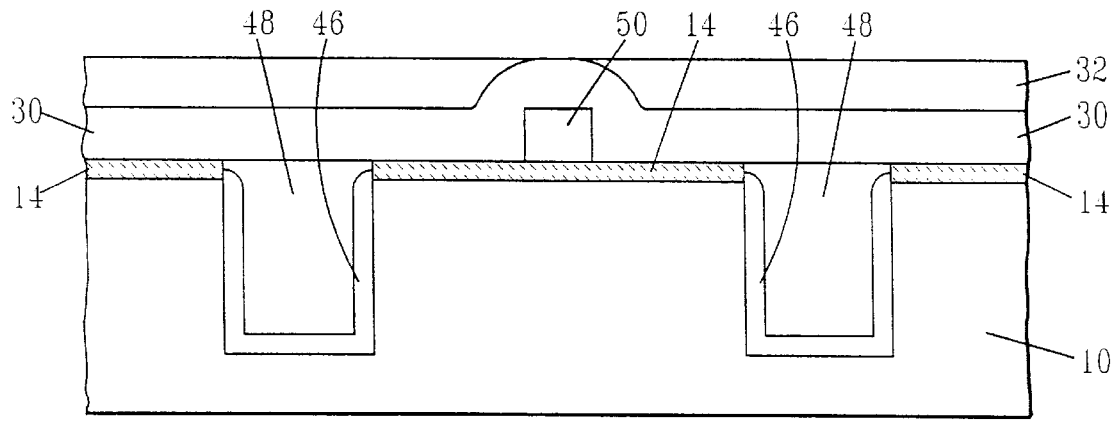
Figure 3J:
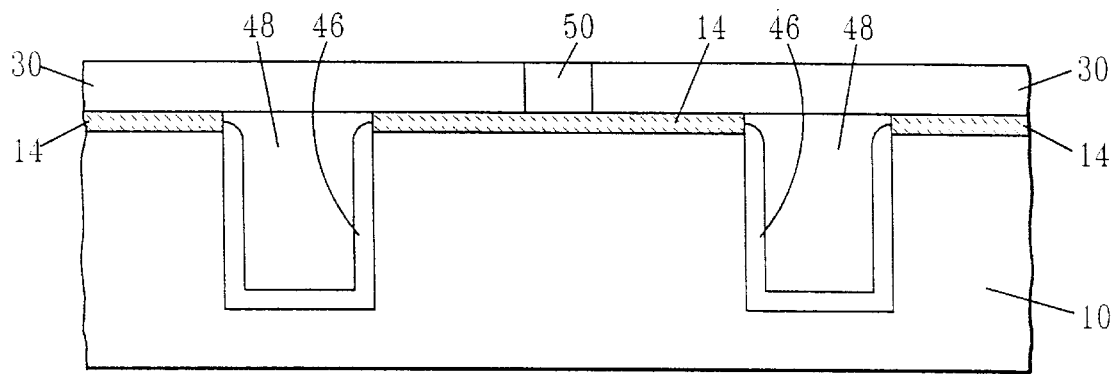

Next, the exposed surfaces of polysilicon layer 50 are removed by RIE and then resist 52 is stripped utilizing conventional stripping processes well known to those skilled in the art. This provides patterned polysilicon region 50 which correlates to patterned region 28 of FIG. 2(a). The structure thus formed is shown in FIG. 3(g). It should be emphasized that the structure shown in FIG. 3(g) is a more complex-type of structure than which is illustrated in FIG. 2(a). Despite its complexity, the structure of FIG. 3(g) is then subjected to the various processing steps mentioned hereinabove. These steps which are illustrated by FIGS. 3(h)–(k) are the same as depicted in FIGS. 2(b)–(e); therefore a detailed description of the same is not needed herein since it is the same as that already mentioned for FIGS. 2(b)–(e).

Figure 3K:
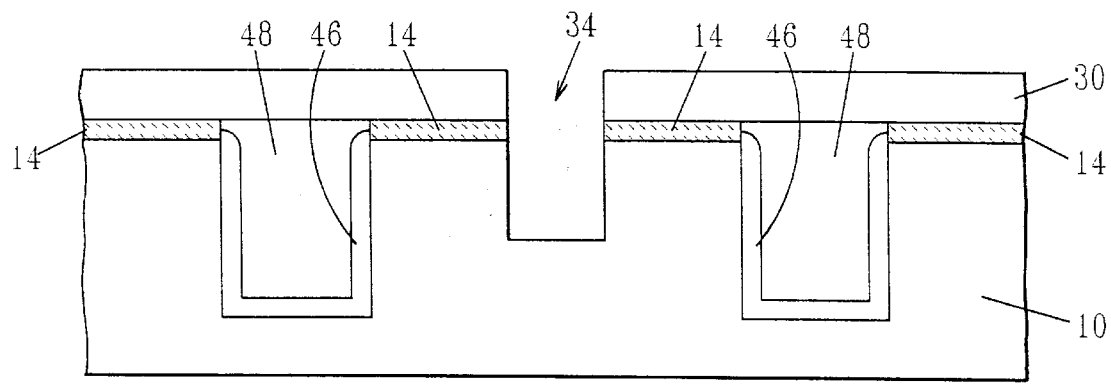

After providing the high aspect ratio hole 34 in the structure shown in FIG. 3(k), the MOSFET processing steps used in the above incorporated related co-assigned U.S. patent application are employed in making the structure shown in FIG. 1. Other MOSFET processing steps besides those mentioned in the related co-assigned U.S. patent application can also be employed herein. Specifically, the following steps can be employed in fabricating the MOSFET structure of FIG. 1:

grow a gate oxide in the high aspect ratio hole utilizing standard growing techniques;

low pressure chemical vapor deposit polysilicon and then planarize the structure;

strip nitride pad layer;

form source/drain regions;

salicidation; and back end of line process, i.e. metal contact formation and interconnection.

While the present invention has been particularly shown and described with respect to preferred embodiments thereof, it will be understood by those skilled in the art that the foregoing and other changes in form and detail may be made without departing from the scope and spirit of the present invention.

Having thus described our invention, what we claim as new, and desire to secure by the Letters Patent is:

1. A process of fabricating a high aspect ratio hole in a semiconductor structure comprising the steps of:

(a) providing a semiconductor structure, said structure comprising at least a semiconductor substrate or wafer having a patterned region with vertical sidewalls on at least one of its surfaces;

(b) applying a dielectric layer on top of said semiconductor surface containing said patterned region;

(c) forming a film layer on the dielectric layer, wherein said film layer planarizes the structure;

(d) etching back said planarized film layer and said dielectric layer stopping at said patterned region; and (e) removing said patterned region, thereby forming a hole having vertical sidewalls and a height:width ratio of 2 or greater.

2. The process of claim 1 wherein said semiconductor substrate or wafer is composed of a semiconducting material selected from the group consisting of Si, Ge, SiGe, GaAs, GaP, InAs, InP and other III/V comoounds.

3. The process of claim 2 wherein said semiconductor substrate or wafer is composed of Si.

4. The process of claim 1 wherein said semiconductor substrate or wafer is of the p-type or the n-type.

5. The process of claim 1 wherein said semiconductor structure or wafer contains active device regions or shallow trench isolation regions embedded therein.

6. The process of claim 1 wherein said semiconductor substrate further includes a pad oxide layer on top of said semiconductor substrate or wafer and said patterned region is a patterned polysilicon region.

7. The process of claim 1 wherein said dielectric layer is formed by a deposition process selected from the group consisting of chemical vapor deposition, plasma vapor deposition, high density plasma vapor deposition, low density plasma vapor deposition and plasma-enhanced chemical vapor deposition.

8. The process of claim 1 wherein said dielectric layer is a dielectric selected from the group consisting of $SiO_3$, $Si_3N_4$, polyimides, paralenes, silicon-containing polymers, diamond and diamond-like carbon.

9. The process of claim 1 wherein dielectric layer is $Si_3N_4$.

10. The process of claim 1 wherein said dielectric layer is a dielectric that is doped with chlorine or fluorine.

11. The process of claim 1 wherein said film layer is composed of a material selected from the group consisting of a spun-on glass and a photoresist.

12. The process of claim 1 wherein said film layer is formed by spin-on coating, dip coating, chemical vapor deposition or plasma chemical vapor deposition.

13. The process of claim 1 wherein said etch back step is carried out by a selective dry etching or wet chemical etching process.

14. The process of claim 13 wherein said etch back step is carried out by reactive ion etching, plasma-etching or ion beam etching.

15. The process of claim 1 wherein step (e) is carried out by etching.

16. The process of claim 1 further comprising forming a gate oxide in said hole.

17. The process of claim 16 wherein said gate oxide is formed by growing a gate oxide in said hole; forming a layer of polysilicon on said grown gate oxide; planarizing the structure; forming source and drain regions in said semiconductor substrate or wafer adjacent to said gate oxide; salicidizing and forming metal contacts in said polysilicon.

* * * * *

UNITED STATES PATENT AND TRADEMARK OFFICE
CERTIFICATE OF CORRECTION

PATENT NO. : 6,063,699
DATED : May 16, 2000
INVENTOR(S) : Hussein I. Hanafi, et al.

It is certified that error appears in the above-identified patent and that said Letters Patent is hereby corrected as shown below:

Column 1, Line 26, Title: "BACKAROUND" should read --BACKGROUND--

Column 8, Line 4, Claim 2: "compoounds" should read --compounds--

Column 8, Line 23, Claim 8: "$SiO_3$" should read --$SiO_2$--

Signed and Sealed this

Tenth Day of April, 2001

Attest:

NICHOLAS P. GODICI

*Attesting Officer*    *Acting Director of the United States Patent and Trademark Office*